US005261006A

United States Patent [19]

Nieuwendijk et al.

[11] Patent Number: 5,261,006

[45] Date of Patent: Nov. 9, 1993

[54] LOUDSPEAKER SYSTEM COMPRISING A HELMHOLTZ RESONATOR COUPLED TO AN ACOUSTIC TUBE

[75] Inventors: Joris A. M. Nieuwendijk; Johannes W. T. Bax; Frans A. Westra, all of Eindhoven, Netherlands

[73] Assignee: U.S. Philips Corporation, New York, N.Y.

[21] Appl. No.: 608,074

[22] Filed: Nov. 1, 1990

[30] Foreign Application Priority Data

Nov. 16, 1989 [NL] Netherlands ........................ 8902831

[51] Int. Cl.[5] ...................... H04R 25/00; H04R 7/00; H05K 5/00

[52] U.S. Cl. .................................... 381/158; 381/159; 181/146; 181/159; 181/160

[58] Field of Search ............... 181/144, 145, 148, 152, 181/155, 160, 175, 146, 159; 381/150, 153, 154, 155, 158, 159, 89

[56] References Cited

U.S. PATENT DOCUMENTS

| | | | |
|---|---|---|---|
| 3,819,879 | 6/1974 | Baechrold | 381/158 |
| 3,944,757 | 3/1976 | Tsukamoto | 181/152 |
| 4,297,538 | 10/1981 | Massa | 381/159 |
| 4,549,631 | 10/1985 | Bose | 181/155 |
| 4,616,731 | 10/1986 | Robinson | 181/148 |
| 4,690,244 | 9/1987 | Dickie | 181/146 |
| 4,805,221 | 2/1989 | Quaas | 381/90 |
| 4,875,546 | 10/1989 | Krnan | 181/160 |
| 4,987,601 | 1/1991 | Goto | 381/159 |
| 5,004,066 | 4/1991 | Furukawa | 181/160 |
| 5,009,281 | 4/1991 | Yokoyama | 181/160 |
| 5,012,890 | 5/1991 | Nagi et al. | 181/160 |
| 5,025,885 | 6/1991 | Froeschle | 181/156 |
| 5,073,945 | 12/1991 | Kageyama et al. | 381/89 |
| 5,115,474 | 5/1992 | Tsuchiya et al. | 381/158 |
| 5,150,418 | 9/1992 | Horda et al. | 381/159 |
| 5,173,575 | 12/1992 | Furukawa | 181/160 |

FOREIGN PATENT DOCUMENTS

| | | | |
|---|---|---|---|
| 0295641 | 12/1988 | European Pat. Off. | 381/159 |
| 0429121 | 5/1991 | European Pat. Off. | 381/159 |
| 3200394 | 10/1988 | Japan | 381/159 |
| 0314098 | 12/1988 | Japan | 381/155 |
| 8908909 | 9/1989 | PCT Int'l Appl. | 381/159 |
| 2037534 | 7/1980 | United Kingdom | 381/159 |

*Primary Examiner*—Jin F. Ng
*Assistant Examiner*—William Cumming
*Attorney, Agent, or Firm*—Bernard Franzblau

[57] ABSTRACT

A loudspeaker system includes a housing (1) having therein at least one loudspeaker (3) which divides the volume of the housing into two parts ($V_1$, $V_2$). The first volume ($V_1$) is coupled, via an aperture in the housing (1), to an acoustic tube (5) which includes a damping element (6). The first volume part ($V_1$) has a smaller volume than the second volume part ($V_2$). The damping element is in the form of a Helmholtz resonator.

35 Claims, 4 Drawing Sheets

LOUDSPEAKER SYSTEM COMPRISING A HELMHOLTZ RESONATOR COUPLED TO AN ACOUSTIC TUBE

BACKGROUND OF THE INVENTION

This invention relates to a loudspeaker system comprising a housing in which at least one acoustic aperture is provided which cooperates with one end of an acoustic tube coupled to the said aperture, which housing comprises a volume which is divided into a first and a second volume part by a loudspeaker arrangement incorporated in the housing, and the first volume part is coupled acoustically with the acoustic aperture in the housing. Such a loudspeaker system is known from German Gebrauchsmuster 83.14.251.

The disadvantage of the known loudspeaker system is that the acoustic output signal is rather coloured and may be distorted. It is an object of the invention to provide a loudspeaker arrangement in which the distortion component in the acoustic output signal may be much lower and in which less colouring occurs in the acoustic output signal.

SUMMARY OF THE INVENTION

For that purpose the loudspeaker arrangement according to the invention is characterized in that the acoustic tube comprises damping means comprising a Helmholtz resonator in the form of a closed volume which is coupled acoustically parallel to the acoustic tube via an aperture, and that the Helmholtz resonator is designed to suppress at least the resonance peak of the lowest frequency in the transmission characteristic of the acoustic tube which would otherwise occur in the absence of the Helmholtz resonator. If the acoustic tube can be made relatively long, the usable frequency range of the loudspeaker can be extended to higher frequencies.

Coupling the Helmholtz resonator parallel to the acoustic tube means that the Helmholtz resonator is coupled to the acoustic tube as a side branch. Such a construction is described elaborately in the literature: see, inter alia, the book "Fundamentals of Acoustics" by L. E. Kinsler et al., John Wiley and Sons, 1962, pp. 202–209.

Such a construction differs entirely from the expansion chamber filter types as they are also used in acoustic tubes, see, inter alia, the above-mentioned book from p. 209 and U.S. Pat. No. 3,944,757. The acoustic effect of such a parallel-coupled Helmholtz resonator also differs from the acoustic behaviour of the expansion chamber type filter.

The invention is based on the recognition of the fact that the output signal of the loudspeaker arrangement is seriously As distorted in particular if the acoustic tube has a considerable length. The air in the acoustic tube can no longer behave as an acoustic mass. This means that the acoustic tube then does not serve so much as a bass-reflex gate, as in the known loudspeaker arrangement, but serves as an acoustic transmission signal. Standing waves are then formed in the acoustic tube (resonances) which are the cause of the distortions and lead to sharp peaks and dips in the transmission characteristic of the device. The colouring is formed in that besides the desired sound, noise is generated as a result of the comparatively high air velocities in the acoustic tube. The result of this is that the noise is intensified at frequencies around the peaks in the transmission characteristic of the tube, which gives rise to colouring of the acoustic output signal. By providing damping means in the form of a Helmholtz resonator which is coupled to the acoustic tube, the said standing waves can be suppressed with a correct tuning of the Helmholtz resonator. The frequency transmission characteristic of the loudspeaker system is flatter as a result, which means less distortion and also less colouring of the acoustic output signal even though the acoustic tube is relatively long.

The loudspeaker system may further be characterized in that the loudspeaker arrangement comprises at least two cascade-arranged loudspeakers. As a result of the cascade arrangement of two or more loudspeakers a larger acoustic power can be generated while the housing still is comparatively small. In the case of a monosignal, the same signal is applied as an electric input signal to all of the two or more loudspeakers. In the case of a stereosignal the left-hand signal part is applied to one loudspeaker and the right-hand signal part of the stereosignal is applied to the second loudspeaker as an electric input signal. This is not a disadvantage for a Woofer system since the stereosignal comprises no low-frequency direction information so that the left and the right signal part are added acoustically in this manner.

All loudspeakers may be arranged in the same direction. In that case the electric signal is applied to all the loudspeakers with the same phase. The cascade arrangement of two loudspeakers in the same direction is known per se, see for this purpose Japanese Kokai 63 -260394. The construction of the loudspeaker system known from the said publication, however, differs from that of the loudspeaker system according to the present invention.

The loudspeakers may also be arranged mirror symmetrically with respect to each other. In that case signals which differ from each other in polarity, are applied to two mirror symmetrically arranged loudspeakers.

It is to be noted that WO 89-8909 describes a sound reflector in the form of a Helmholtz resonator which is coupled parallel to an acoustic tube. The object of this is to relect sound waves which are applied by a noise source at one end of the acoustic tube so that they are not radiated at the other end. This means that the Helmholtz resonator is proportioned so that the Helmholtz frequency is approximately equal to the frequency of the lowest tone in the acoustic signal of the noise source.

Various preferred embodiments are described in the other sub-claims.

BRIEF DESCRIPTION OF THE DRAWING

The invention will now be described in greater detail with reference to a number of embodiments in tile description of the Figures. In the drawing.

DESCRIPTION OF THE PREFERRED EMBODIMENTS

Figure 1:
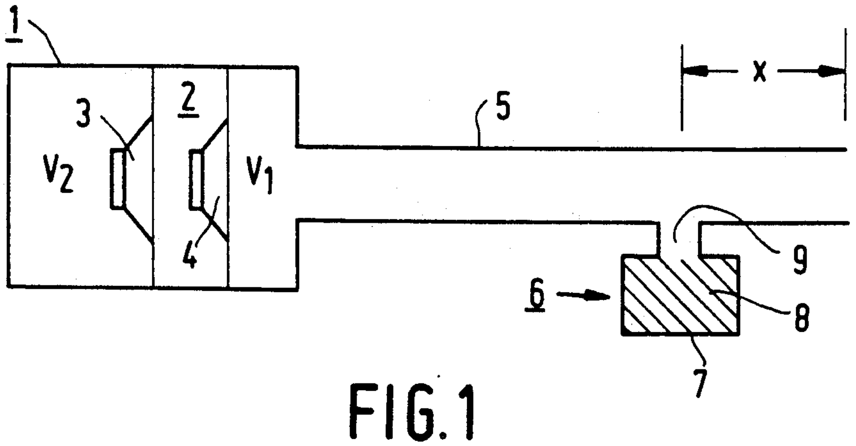
FIG. 1 shows a first.

FIG. 1 shows a first embodiment of the loudspeaker system comprising a housing 1 in which a loudspeaker arrangement 2 is incorporated. The loudspeaker arrangement comprises at least one loudspeaker. The loudspeaker arrangement 2 of FIG. 1 comprises two loudspeakers 3 and 4 which are arranged in cascade. The loudspeaker arrangement divides the volume of the housing 1 into first and second chambers, i.e. into a first and a second volume part $V_1$ and $V_2$, respectively. The volume between the two loudspeakers is so small that it bas a high mechanical rigidity. The first volume part $V_1$ is coupled acoustically to one end of the acoustic tube 5 via an aperture. The tube 5 comprises damping means 6. The damping means are intended to damp standing waves which would occur in the absence of the damping means. The damping means are in the form of a Helmholtz resonator 6 comprising a further closed volume 7 which is filled with an acoustic damping material 8. Said tube cooperates acoustically with the Helmholtz resonator via an aperture 9 in the wall of the tube 5. The distance x between the aperture 9 and the end of the tube preferably is between 0.03 and 0.5 m. The volume part $V_1$ generally is smaller than the volume part $V_2$. The loudspeakers 3 and 4 are arranged in the same direction and a (mono)signal of the same phase is hence applied to each of them.

The operation of Helmholtz resonators is described in the book "Fundamentals of Acoustics" by L. E. Kinsler and A. R. Frey, John Wiley (1962), see in particular sec. 8.9. In the absence of the Helmholtz resonator the transmission characteristic of the acoustic tube shows a structure with resonance peaks corresponding to the resonances as a result of standing waves in the tube. The Helmholtz resonator is proportioned so that the resonant frequency of the Helmholtz resonator, corresponding to the dip in the curve of FIG. 8, 9 in the book by Kinsler and Frey, at least approximately equal to or is higher than the lowest resonance peak in the transmission characteristic of the acoustic tube 5.

An acoustically damping material 8 is provided in the space of the Helmholtz resonator. For this purpose one may consider, for example, cotton fibres (wadding) or synthetic resin fibres which have an acoustic damping property.

The acoustic damping material 8 has been chosen so that for the Q-factor $Q_H$ of the Helmholtz resonator, it holds that $0.25 \leqq Q_H < 2$. $Q_H$ is preferably at least equal to 1 $Q_H$ is defined as follows:

$$Q_H = \frac{2\pi f_H m_{AH}}{R_{AH}}$$

wherein $f_H$ are the resonant frequencies of the Helmholtz resonator for which it holds that $$f_H = 1/2\pi \sqrt{m_{AH} \cdot C_{AH}}$$

$m_{AH}$ is the acoustic mass of the air in the gate of the Helmholtz resonator [kg/m$^4$]

$C_{AH}$ is the acoustic compliance of the air in the resonator itself [m$^4$·s$^2$/kg], $R_{AH}$ is the acoustic resistance in the air volume of the resonator [kg/m$^4$·s].

Figure 5:
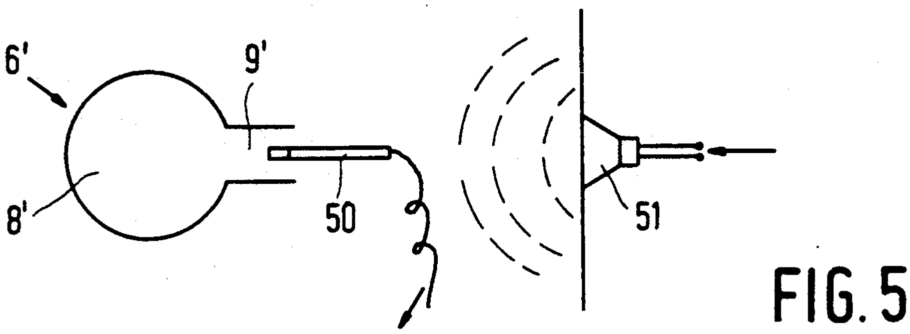
FIG. 5 shows a measuring arrangement for determining the Q-factor of a Helmholtz resonator.

The Q-factor $Q_H$ may be measured in the manner as is shown in FIG. 5. The air velocity in the gate 9' of the Helmholtz resonator 6' is measured by means of a tachometer 50 as a function of the frequency when driving with a source loudspeaker 51. In the logarithmic characteristic ($20^{10}$ log) of the air velocity as a function of the frequency the −3 dB points are then determined. These points lie near the frequencies f1 and f2. The Q-factor can now be computed by means of the following formula $$Q_H = \frac{f_2 - f_1}{f_H}$$

For the area $O_1$ of the perpendicular cross-section of the gate 9 of the Helmholtz resonator 6 and the area $O_2$ of the perpendicular cross-section of the acoustic tube 5 it holds that $0.25 < O_1/O_2 < 3$. Both areas are preferably taken to be approximately equally large.

FIG. 6 shows three frequency characteristics illustrating the influence of a Helmholtz resonator on a loudspeaker system as shown in FIG. 1.

Figure 6A:
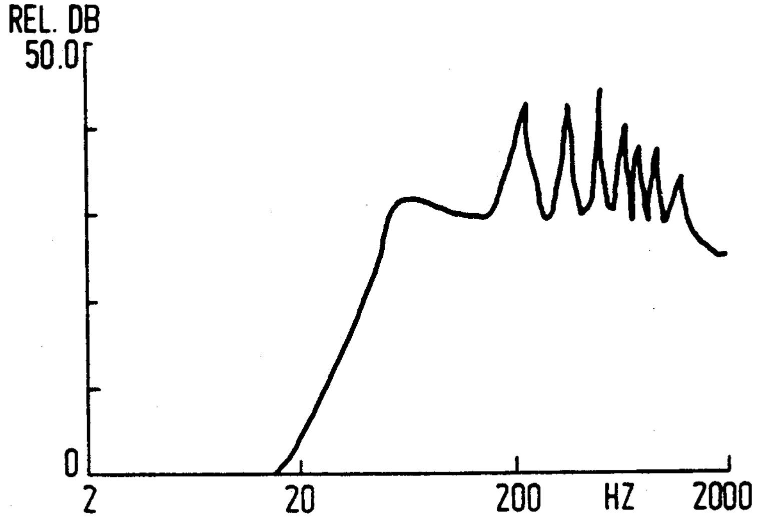
FIGS. 6a–c shows three frequency characteristics, which consists of FIGS. 6a, 6b and 6c, FIGS. 7, 8 and 9 show three embodiments in which the acoustic tube serves as a standard.

FIG. 6a shows the frequency characteristic of the loudspeaker system without the Helmholtz resonator. The characteristic indicates the sound pressure (in dB) as a function of the frequency with a constant input signal (voltage) at the loudspeakers. The frequency is logarithmically along the horizontal axis. The peaks which occur as a result of the standing waves in the tube 5 are clearly visible in the characteristic.

Figure 6B:
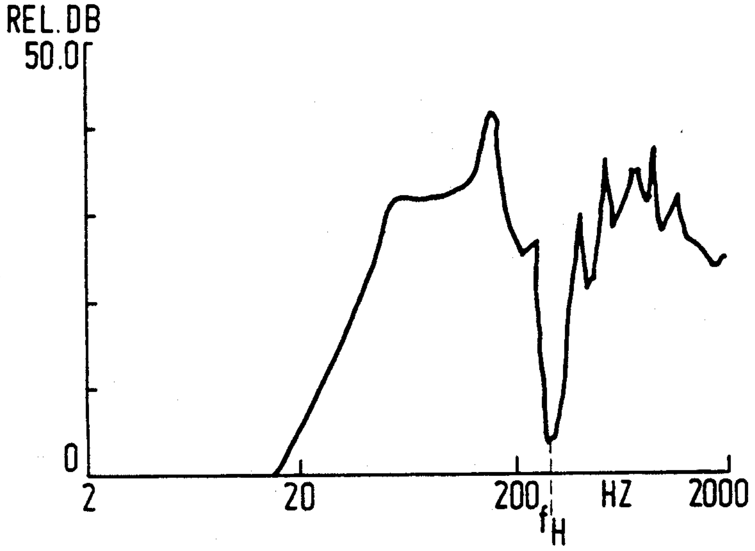

In this case it relates to a Woofer system. It will be obvious that the system can be used only for frequencies up to at most 150 Hz. FIG. 6b shows the frequency characteristic of the system comprising a Helmholtz resonator but in which no acoustic damping material has been provided in the space of the Helmholtz resonator. Clearly visible in this characteristic is the resonant frequency $f_H$ of the Helmholtz resonator. The system of FIG. 6b cannot be used either in view of the intensity at $f_H$.

Figure 6C:
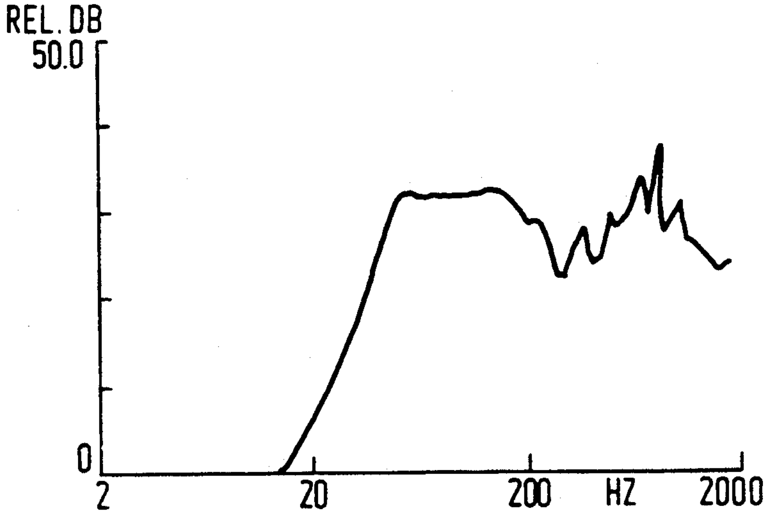

FIG. 6c shows the system in which the Q-factor $Q_H$ of the Helmholtz resonator is equal to 1.

The resulting characteristic is reasonably flat and can easily be used up to a frequency of 250 Hz.

The remaining peak(s) occur only far beyond the frequency range of the loudspeaker system and may optionally be filtered electrically or by means of a second Helmholtz resonator.

Figure 2:
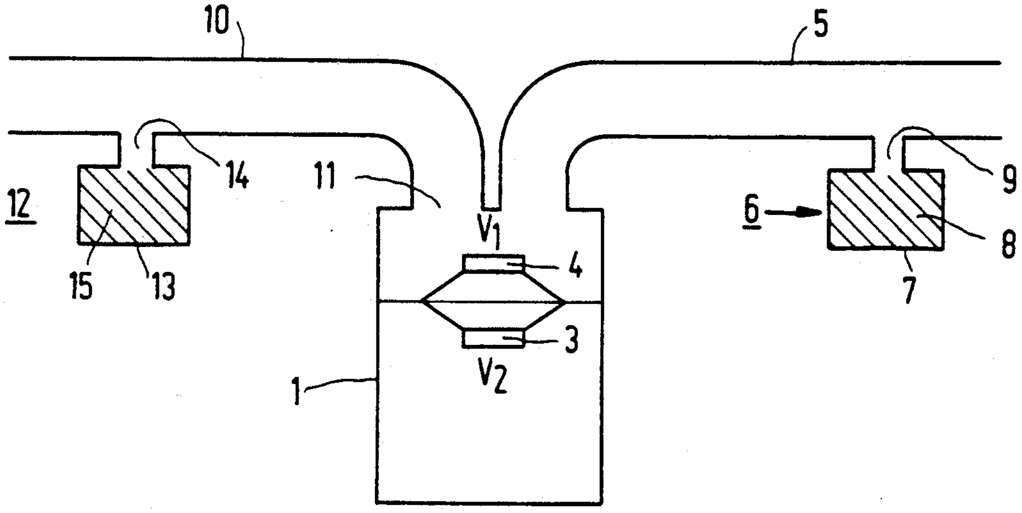
FIG. 2 shows a second embodiment of the loudspeaker system.

FIG. 2 shows an embodiment which resembles that of FIG. 1. The two loudspeakers 3 and 4 in this case are arranged mirror symmetrically with respect to each other. A (mono)signal is applied to them this time with a polarity opposite to each other. The loudspeaker system of FIG. 2 further comprises a second acoustic tube 10 which is coupled of one end to a second aperture 11 in the housing 1. Via said aperture the tube 10 is coupled acoustically to the volume $V_1$. The tube 10 also comprises damping means 12. The damping means 12 are in the form of a Helmholtz resonator and, like the damping means 6, comprise a further closed volume 13 which is coupled acoustically to the tube 10 via an aperture 14 in the wall of the tube 10. An acoustic damping material 15 is provided in the volume 13.

Figure 3:
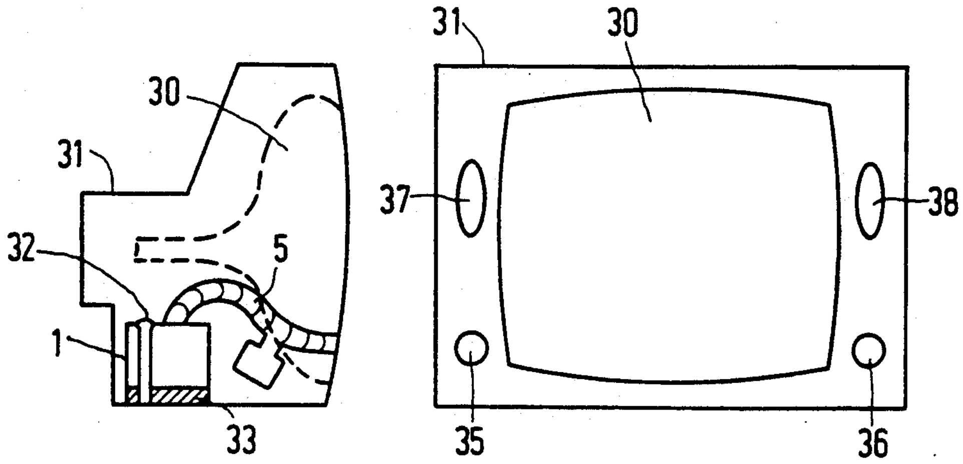
FIG. 3 shows the use of the loudspeaker system in a television set.

The loudspeaker system of FIG. 1 and FIG. 2 can be used with good effect in a consumer apparatus that requires a loudspeaker system, for example, a television set. This is shown in FIG. 3. FIG. 3 shows diagrammatically a television set having a television tube. The housing 1 is provided in a suitable place in the housing 31 of the television set. The housing 1 is connected to the housing 31 of the television set by means of a connection tape 32. A damping layer 33 of, for example, a rubber has been provided between the housing 31 of the television set and the housing 1 of the loudspeaker system. Said layer 33 serves to damp the mechanical vibrations of the housing 1 so that they are not transferred to the housing 31 of the television set.

If the loudspeaker system comprises one acoustic pipe 5, the other end of said pipe is coupled to an aperture 35 in the housing of the television set. If the loudspeaker system comprises two acoustic tubes 5 and 10, the other end of the tube 10 is coupled to an aperture 36 in the housing 31. The acoustic pipe(s) may be manufactured from a flexible hose. The hoses may optionally comprise reinforcing rings.

The television set may optionally comprise two medium-high tower loudspeakers 37 and 38 for the reproduction of the intermediate and/or high-frequency part of the audio information and in which the stereoinformation is present.

Figure 4A:
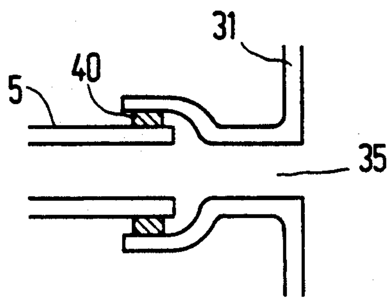
FIGS. 4*a–c* shows three constructions of the connection of an acoustic tube to the housing of the television set.

The coupling of the other end of the acoustic tube 5 to the housing 31 of the television set is shown in FIG. 4. In FIG. 4*a* the end is coupled to the housing 31 of the television set via a damping layer 40. The damping layer 40, for example, of rubber or foam, is also intended to prevent mechanical vibrations from being transmitted from the tube 5 to the housing 31.

Figure 4B:
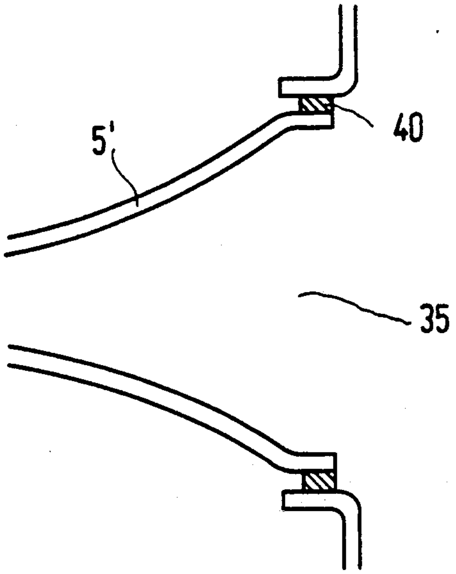
Figure 4C:
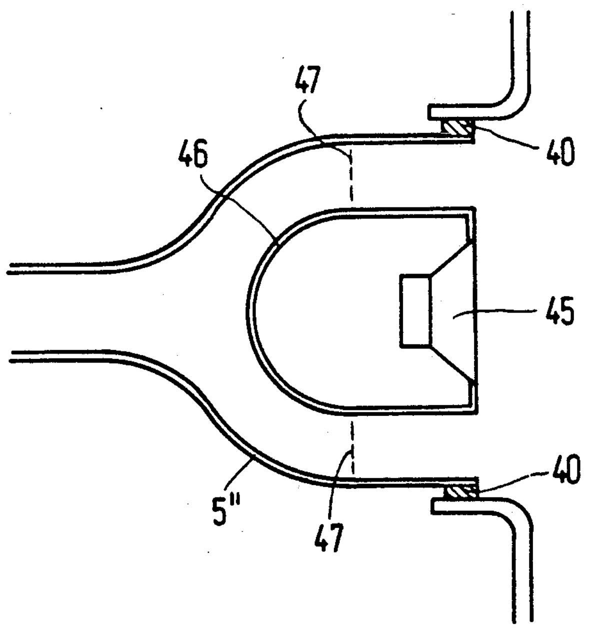

FIG. 4*b* shows the case in which the tube 5, in this case referred to by reference numeral 5′, has a cross-section which increases towards the end. As a result of this a better acoustic matching to the acoustic medium around the television set is obtained. FIG. 4*c* also shows a tube 5″ having a cross-section which increases towards the end. A medium and/or high tone loudspeaker 45 is provided in said aperture. The loudspeaker 45 for that purpose is provided in a pot-like construction 46 which itself is connected via supporting beams 47 to the output aperture of the tube 5″. An acoustic damping material may be provided in the pot 46.

Optionally it is possible to cause the volume $V_1$ in the housing to cooperate with an acoustic tube via an aperture in said housing. The other end of the said tube may then also be coupled to an aperture in, for example, the rear side of the housing 31 of the television set.

Figure 7:
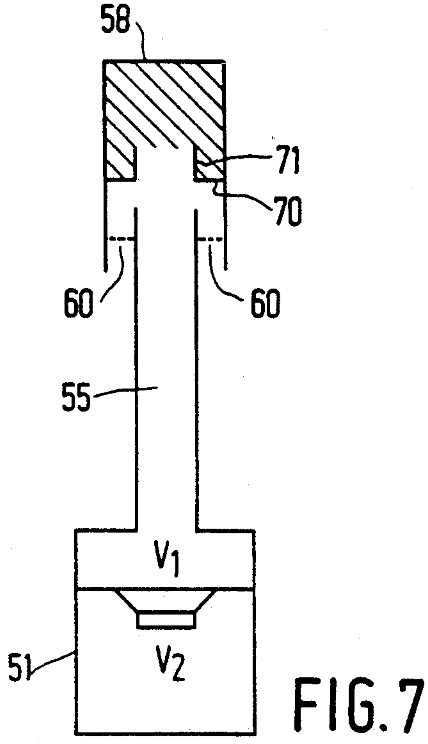
Figure 8:
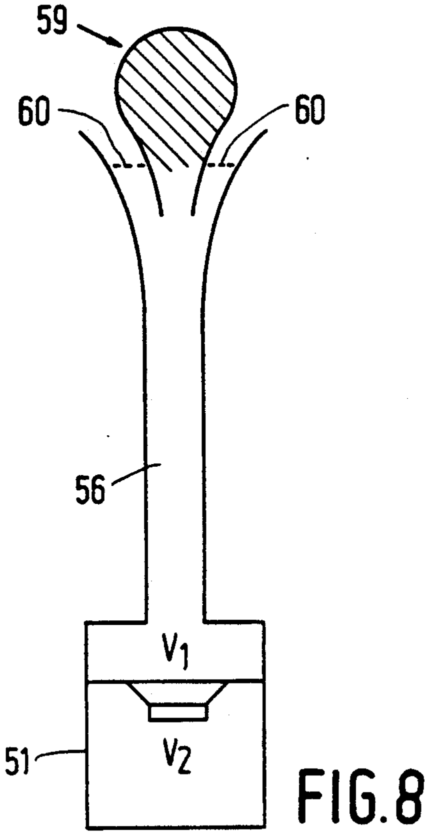
Figure 9:
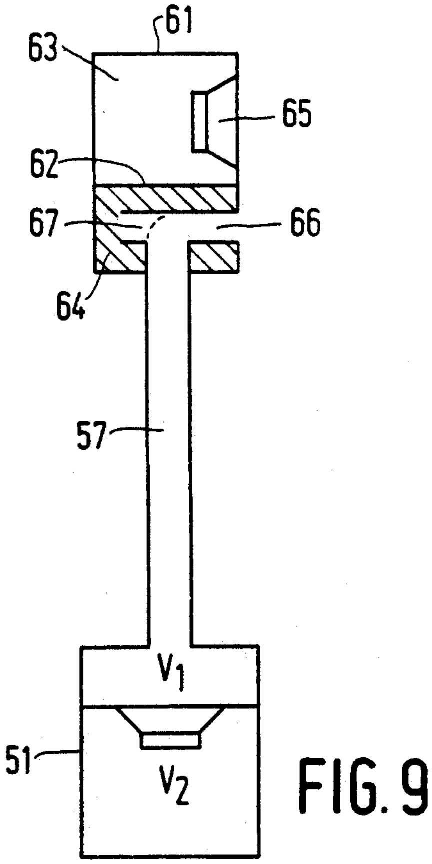

FIGS. 7, 8 and 9 show loudspeaker systems in which the acoustic tube is constructed as a standard. In this case the loudspeaker system is arranged vertically. In all cases the housing 51 comprises one loudspeaker which divides the space in the housing into two volume parts $V_1$ and $V_2$ for which it holds again that $V_1 < V_2$. FIG. 7 shows a Helmholtz resonator 58 which is provided coaxially with respect to the axis of the tube 55. It is to be noted that for a correct operation of the Helmholtz resonator in FIG. 7 the partition 70 and the tube 71 are not essential and hence may optionally be omitted. Adjusting the Helmholtz resonator frequency may then be realised by moving the pot 58 up or down on the tube 55, in which the damping material is removed from the pot 58. Each time the frequency characteristic of the loudspeaker system is measured. This frequency characteristic shows the dip as a result of the Helmholtz resonance frequency as is shown in FIG. 6*b*. The pot 58 is moved upwards or downwards over the tube 55 until said dip lies in the correct place and then hence satisfies the requirement of claim 5. Herewith the position of the pot 58 is fixed with respect to the tube 55. The damping material may then be provided in the pot 58.

FIG. 8 shows a construction in which the Helmholtz resonator is provided (partly) in the sound emanating aperture of the tube 56. The shape of the said aperture is again flared. The Helmholtz resonators are connected to the acoustic tube by means of supporting beams 60.

FIG. 9 shows a loudspeaker system having a second housing 61. Said housing is divided into two spaces 63 and 64 by means of a partition 62. The space 63 comprises a loudspeaker 65 in its wall. This may be, for example, a medium and/or high tone loudspeaker.

The acoustic tube 57 opens into an aperture 66 provided in the housing 63. This part together with the tube part 67 again forms the Helmholtz resonator.

Figure 10:
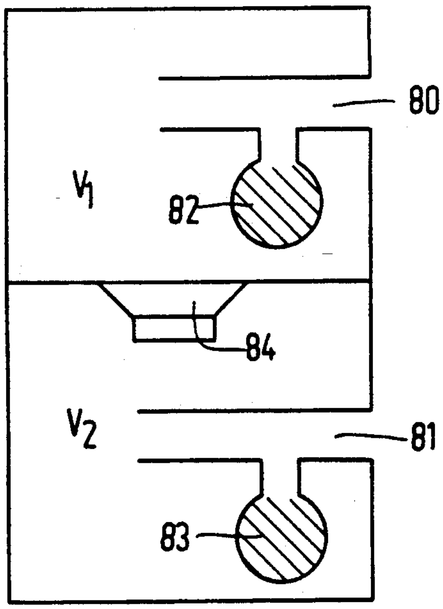
FIG. 10 shows still another embodiment.

It is to be noted that the invention is not restricted to only the embodiments shown. The invention may also be applied to embodiments which differ from the embodiments shown in points not relating to the invention. For example, the invention also relates to a construction as it is known from U.S. Pat. No. 4,549,631. Such a construction is shown in FIG. 10. The invention means that a Helmholtz resonator is coupled to one or both bass-reflex gates 80 and 81, respectively. FIG. 10 shows Helmholtz resonators 82 and 83, respectively, at each of the bass-reflex gates.

We claim:

1. A loudspeaker system comprising: a housing which includes at least one acoustic aperture which cooperates with one end of an acoustic tube coupled to said aperture, which housing comprises a volume which is divided into a first and a second volume part by a loudspeaker arrangement incorporated in the housing and with the first volume part coupled acoustically to the acoustic aperture in the housing, characterized in that the acoustic tube comprises damping means comprising a Helmholtz resonator in the form of a closed volume which is coupled acoustically parallel to the acoustic tube via an aperture in the volume of the Helmoltz resonator, and that the Helmholtz resonator has a Q-factor $Q_H$, where $0.25 \leqq Q_H \leqq 2$, and is designed to suppress at least the resonance peak of the lowest frequency in the transmission characteristic of the acoustic tube which would otherwise occur in the absence of the Helmoltz resonator.

2. A loudspeaker system as claimed in claim 1, wherein an acoustic damping material is incorporated in the volume of the Helmholtz resonator.

3. A loudspeaker system as claimed in claim 2 wherein the damping material is chosen so that the Helmholtz resonator has the Q-factor $Q_H$ in which $0.25 \leqq Q_H \leqq 2$.

4. A loudspeaker system as claimed in claim 3 wherein, the first volume part is coupled acoustically to a second acoustic aperture in the housing, said second acoustic aperture cooperates with one end of a second acoustic tube coupled to said second aperture, and said second acoustic tube also comprises damping means in the form of a Helmholtz resonator.

5. A loudspeaker system as claimed in claim 3 wherein, the second volume part is coupled acoustically to a second acoustic aperture in the housing of the loudspeaker system, the second acoustic aperture cooperates with one end of a second acoustic tube coupled to said second aperture, and said second tube also comprises damping means in the form of a Helmholtz resonator.

6. A loudspeaker system as claimed in claim 2, wherein the aperture in the volume of the Helmholtz resonator otherwise closed is coupled acoustically to an aperture in a side wall of the acoustic tube.

7. A loudspeaker system as claimed in claim 6 wherein the damping material is chosen so that the Helmholtz resonator has the Q-factor $Q_H$ in which $0.25 \leqq Q_H \leqq 2$.

8. A loudspeaker system as claimed in claim 7 wherein the ratio of an area $O_1$ of the aperture in the side wall of the acoustic tube to a surface area $O_2$ of a perpendicular cross-section of the acoustic tube is $0.25 \leqq O_1/O_2 \leqq 3$.

9. A loudspeaker system as claimed in claim 6 wherein the ratio of an area $O_1$ of the aperture in the side wall of the acoustic tube to a surface area $O_2$ of a perpendicular cross-section of the acoustic tube is $0.25 \leqq O_1/O_2 \leqq 3$.

10. A loudspeaker system as claimed in claim 2, wherein the Helmholtz frequency of the Helmholtz resonator is at least approximately equal to or is higher than the lowest resonance peak in the transmission characteristic of the acoustic tube which would otherwise occur in the absence of the Helmholtz resonator.

11. A loudspeaker system as claimed in claim 10 wherein the damping material is chosen so that the Helmholtz resonator has the Q-factor $Q_H$ in which $0.25 \leqq Q_H \leqq 2$.

12. A loudspeaker system as claimed in claim 10 wherein, the first volume part is coupled acoustically to a second acoustic aperture in the housing, said second acoustic aperture cooperates with one end of a second acoustic tube coupled to said second aperture, and said second acoustic tube also comprises damping means in the form of a Helmholtz resonator.

13. A loudspeaker system as claimed in claim 10 wherein, the second volume part is coupled acoustically to a second acoustic aperture in the housing of the loudspeaker system, the second acoustic aperture cooperates with one end of a second acoustic tube coupled to said second aperture, and said second tube also comprises damping means in the form of a Helmholtz resonator.

14. A loudspeaker system as claimed in claim 1 wherein the aperture in the volume of the Helmholtz resonator otherwise closed is coupled acoustically to an aperture in a side wall of the acoustic tube.

15. A loudspeaker system as claimed in claim 14, wherein the aperture in the side wall of the acoustic tube is provided at a distance x from a sound emanating end of the acoustic tube, and wherein x lies between 0.03 m and 0.5 m.

16. A loudspeaker system as claimed in claim 15, wherein the Helmholtz frequency of the Helmholtz resonator is at least approximately equal to or is higher than the lowest resonance peak in the transmission characteristic of the acoustic tube which would otherwise be present in the absence of the Helmholtz resonator.

17. A loudspeaker system as claimed in claim 14, wherein the Helmholtz frequency of the Helmholtz resonator is at least approximately equal to or is higher than the lowest resonance peak in the transmission characteristic of the acoustic tube which would otherwise occur in the absence of the Helmholtz resonator.

18. A loudspeaker system as claimed in claim 17 wherein the ratio of an area $O_1$ of the aperture in the side wall of the acoustic tube to a surface area $O_2$ of a perpendicular cross-section of the acoustic tube is $0.25 \leqq O_1/O_2 \leqq 3$.

19. A loudspeaker system as claimed in claim , wherein $Q_H$ is approximately equal to 1 and the acoustic tube is a relatively long tube having an acoustic transmission characteristic.

20. A loudspeaker system as claimed in claim 1, wherein the first volume part is coupled acoustically to a second acoustic aperture in the housing, said second acoustic aperture cooperates with one end of a second acoustic tube coupled to said second aperture, and said second acoustic tube also comprises damping means in the form of a Helmholtz resonator.

21. A loudspeaker system as claimed in claim 1 wherein the loudspeaker arrangement comprises two cascade-arranged loudspeakers.

22. A loudspeaker system as claimed in claim 1, characterized in that the loudspeaker system is incorporated in a housing of a consumer apparatus, and that the housing of the loudspeaker system is coupled to the housing of the consumer apparatus via second damping means for providing a vibration damping.

23. A loudspeaker system as claimed in claim 22, wherein a second end of the acoustic tube is coupled to an aperture in the housing of the consumer apparatus.

24. A loudspeaker system as claimed in claim 23, characterized in that the other end of an acoustic tube is coupled to the housing of the consumer apparatus via third damping means for providing a vibration damping.

25. A loudspeaker system as claimed in claim 1 wherein at least that part of the acoustic tube which is located near its other end has a cross-section which increases in the direction of said other end.

26. A loudspeaker system as claimed in claim 1 wherein, the second volume part is coupled acoustically to a second acoustic aperture in the housing of the loudspeaker system, the second acoustic aperture cooperates with one end of a second acoustic tube coupled to said second aperture, and said second tube also comprises damping means in the form of a Helmholtz resonator.

27. A loudspeaker system comprising: a housing which includes at least one acoustic aperture which cooperated with one end of an acoustic tube coupled to said aperture, said housing comprising a volume which is divided into a first and a second volume part by a loudspeaker arrangement incorporated in the housing and with the first volume part coupled acoustically to the acoustic aperture in the housing, characterized in that the acoustic tube comprises damping means comprising a Helmholtz resonator in the form of a closed volume which is coupled acoustically parallel to the acoustic tube via an aperture in a side wall of the tube, and that the Helmholtz resonator is designed to suppress at least the resonance peak of the lowest frequency in the transmission characteristic of the acoustic tube which otherwise would occur in the absence of the Helmholtz resonator, wherein the ratio of an area $O_1$ of the aperture in the side wall of the acoustic tube to a surface area $O_2$ of a perpendicular cross-section of the acoustic tube is $0.25 \leqq O_1/O_2 \leqq 3$, and wherein the Helmholtz resonator has a closed volume with an aperture therein acoustically coupled to said aperture in the side wall of the acoustic tube.

28. A loudspeaker system as claimed in claim 1 wherein the first volume part has a smaller volume than the second volume part.

29. A loudspeaker system as claimed in claim 27, wherein the area $O_1$ is at least approximately equal to the area $O_2$.

30. A loudspeaker system as claimed in claim 27 wherein, the first volume part is coupled acoustically to a second acoustic aperture in the housing, said second acoustic aperture cooperates with one end of a second acoustic tube coupled to said second aperture, and said second acoustic tube also comprises damping means in the form of a Helmholtz resonator.

31. A loudspeaker system comprising: a housing which comprises a loudspeaker arrangement within the housing and with the housing divided into first and second air chambers wherein the second air chamber is closed and the first air chamber includes at least one acoustic aperture acoustically coupled to one end of a long acoustic tube, a Helmholtz resonator damping device having a closed chamber coupled acoustically in parallel with the acoustic tube via an aperture in the Helmholtz resonator coupled to an aperture in a side wall of the acoustic tube, said aperture in the side wall of the acoustic tube being located at a distance between 0.03 m and 0.5 m from the other end of said acoustic tube, and wherein the Helmholtz frequency of the Helmholtz resonator is equal to or is higher than the lowest resonance peak in the transmission characteristic of the acoustic tube which would otherwise occur in the absence of the Helmholtz resonator.

32. A loudspeaker system as claimed in claim 31 comprising first and second loudspeakers mounted within said first and second air chambers, respectively.

33. A loudspeaker system: comprising: a housing which comprises a loudspeaker arrangement within the housing which divides the housing into first and second air chambers wherein the first air chamber includes at least one acoustic aperture acoustically coupled to one end of an acoustic tube, a Helmholtz resonator damping device having a closed chamber coupled acoustically in parallel with the acoustic tube via an aperture in the Helmholtz resonator coupled to an aperture in a wall of the acoustic tube, wherein the Helmholtz frequency of the Helmholtz resonator is equal to or is higher than the lowest resonance peak in the transmission characteristic of the acoustic tube which would otherwise occur in the absence of the Helmholtz resonator, and the Helmholtz resonator has a Q-factor $Q_H$, where $0.25 \leqq Q_H \leqq 2$.

34. A loudspeaker system as claimed in claim 33 further comprising an acoustic damping material within the Helmholtz resonator, and wherein the ratio of an area $O_1$ of the aperture in the wall of the acoustic tube to a surface area $O_2$ of a perpendicular cross-section of the acoustic tube is $0.25 \leqq O_1/O_2 \leqq 3$.

35. A loudspeaker system comprising: a housing which comprises a loudspeaker arrangement within the housing which divides the housing into first and second air chambers wherein the first air chamber includes at least one acoustic aperture acoustically coupled to one end of an acoustic tube, a Helmholtz resonator damping device having a closed chamber with an acoustic damping material therein and coupled acoustically in parallel with the acoustic tube via an aperture in the Helmholtz resonator coupled to an aperture in a wall of the acoustic tube, said aperture in the side wall of the acoustic tube being located at a distance X from a sound emitting end of the acoustic tube, where X lies between 0.03 m and 0.5 m, and the ratio of an area $O_1$ of the aperture in the wall of the acoustic tube to a surface area $O_2$ of a perpendicular cross-section of the acoustic tube is $0.25 \leqq O_1/O_2 \leqq 3$, wherein the Helmholtz frequency of the Helmholtz resonator is equal to or is higher than the lowest resonance peak in the transmission characteristic of the acoustic tube which would otherwise occur in the absence of the Helmholtz resonator, and the Helmholtz resonator has a Q-factor $Q_H$, where $0.25 \leqq Q_H \leqq 2$.

* * * * *